(12) United States Patent
Chao et al.

(10) Patent No.: US 10,473,713 B2
(45) Date of Patent: Nov. 12, 2019

(54) INTERPOSER BLOCK WITH RETRACTABLE SPRING PIN TOP COVER PLATE

(71) Applicant: Xilinx, Inc., San Jose, CA (US)

(72) Inventors: Alan Shu-Jen Chao, San Jose, CA (US); Owais E. Malik, San Jose, CA (US)

(73) Assignee: XILINX, INC., San Jose, CA (US)

( * ) Notice: Subject to any disclaimer, the term of this patent is extended or adjusted under 35 U.S.C. 154(b) by 171 days.

(21) Appl. No.: 15/795,012

(22) Filed: Oct. 26, 2017

(65) Prior Publication Data

US 2019/0128955 A1    May 2, 2019

(51) Int. Cl.
*G01R 31/28* (2006.01)
*G01R 1/04* (2006.01)
*G01R 31/26* (2014.01)
*G01R 31/3185* (2006.01)

(52) U.S. Cl.
CPC ....... *G01R 31/2889* (2013.01); *G01R 1/0408* (2013.01); *G01R 1/0433* (2013.01); *G01R 31/26* (2013.01); *G01R 31/318511* (2013.01)

(58) Field of Classification Search
CPC .... G01R 31/00; G01R 31/28; G01R 31/2851; G01R 31/2886; G01R 31/2889; G01R 31/002; G01R 31/043; G01R 31/26; G01R 31/2648; G01R 31/2806; G01R 31/2808; G01R 31/2868; G01R 31/31702; G01R 31/318511; G01R 1/00; G01R 1/02; G01R 1/04; G01R 1/0408; G01R 1/0433; G01R 1/0441; G01R 1/045; G01R 1/0466; G01R 1/0491
USPC ..... 324/500, 512, 527, 537, 756.01, 756.07, 324/757.01, 757.02, 757.04, 762.01, 324/762.02, 763.01
See application file for complete search history.

(56) References Cited

U.S. PATENT DOCUMENTS

| | | | | |
|---|---|---|---|---|
| 4,845,593 | A | * | 7/1989 | Brown ................... H01R 13/44 361/192 |
| 5,247,246 | A | * | 9/1993 | Van Loan ............ G01R 31/316 324/754.14 |
| 2009/0120668 | A1 | * | 5/2009 | Fjelstad ............... H01R 12/523 174/250 |

(Continued)

*Primary Examiner* — Hoai-An D. Nguyen
(74) *Attorney, Agent, or Firm* — Patterson + Sheridan, LLP

(57) ABSTRACT

An interposer block, a chip package assembly test system and method for testing a chip package assembly are described herein. In one example, an interposer block for an integrated circuit chip package test system is provided. The interposer block includes a main body, a retainer plate, and a cover plate. A plurality of spring pins are each disposed in a respective one of a plurality of spring pin receiving holes formed in the main body. The retainer plate is coupled to the main body and captures the spring pins within the plurality of spring pin receiving holes. The cover plate is movably coupled to the main body. The cover plate has a plurality of spring pin clearance holes form therethrough that align with the plurality of spring pin receiving holes formed in the main body. A spring bias the cover plate away from the main body to a position where the spring pins not an exposed through a top surface the cover plate, and where the cover plate is movable towards the main body to a position that exposes the spring pins through the top surface of the cover plate.

20 Claims, 9 Drawing Sheets

(56) References Cited

U.S. PATENT DOCUMENTS

2012/0306523 A1* 12/2012 Kwon ................ G01R 1/07378
                                                    324/755.01
2017/0220053 A1*  8/2017 Shu ....................... F16K 17/048
2018/0106322 A1*  4/2018 Nakasone ................. B60R 7/06

* cited by examiner

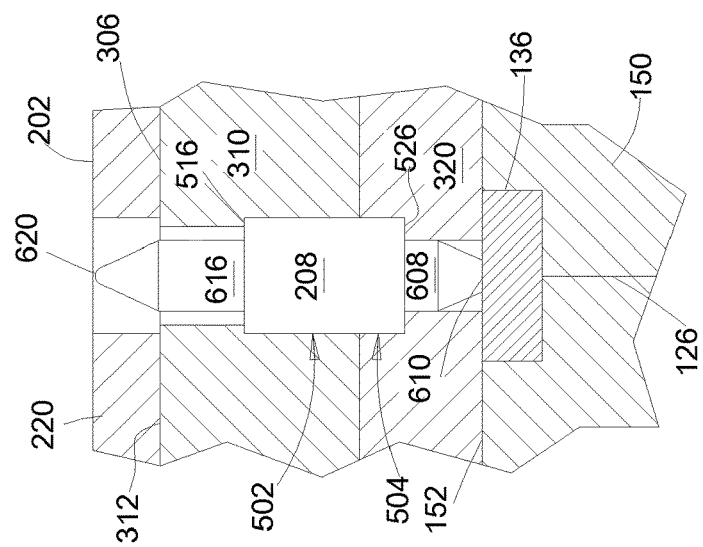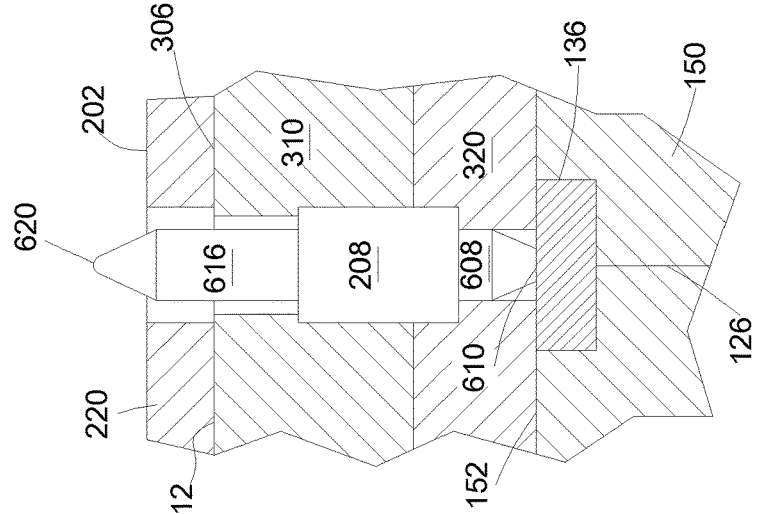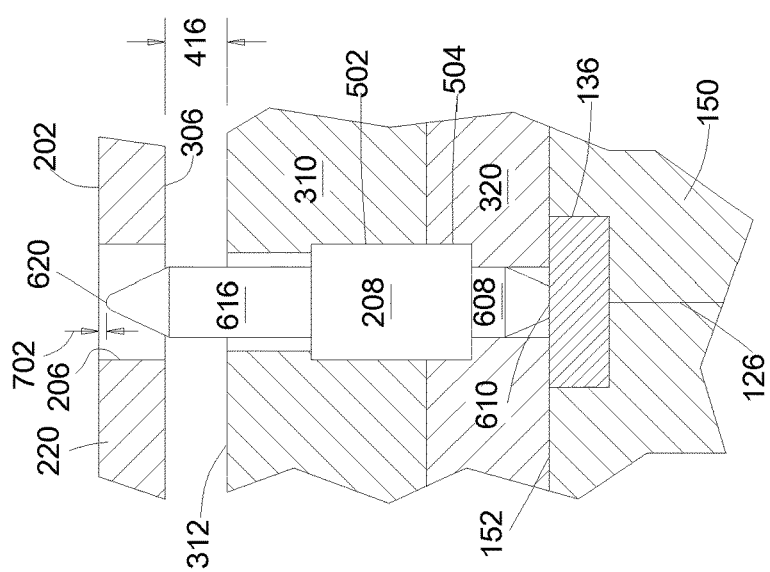

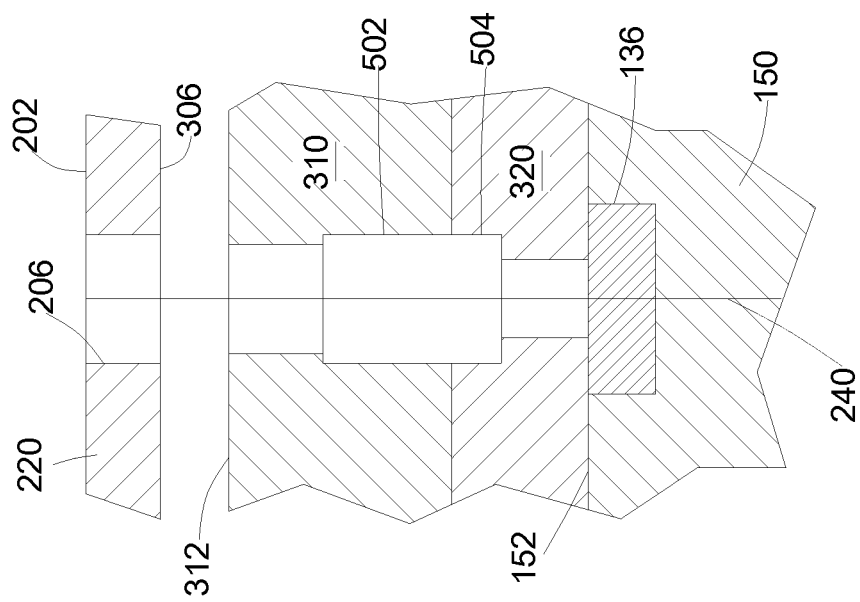

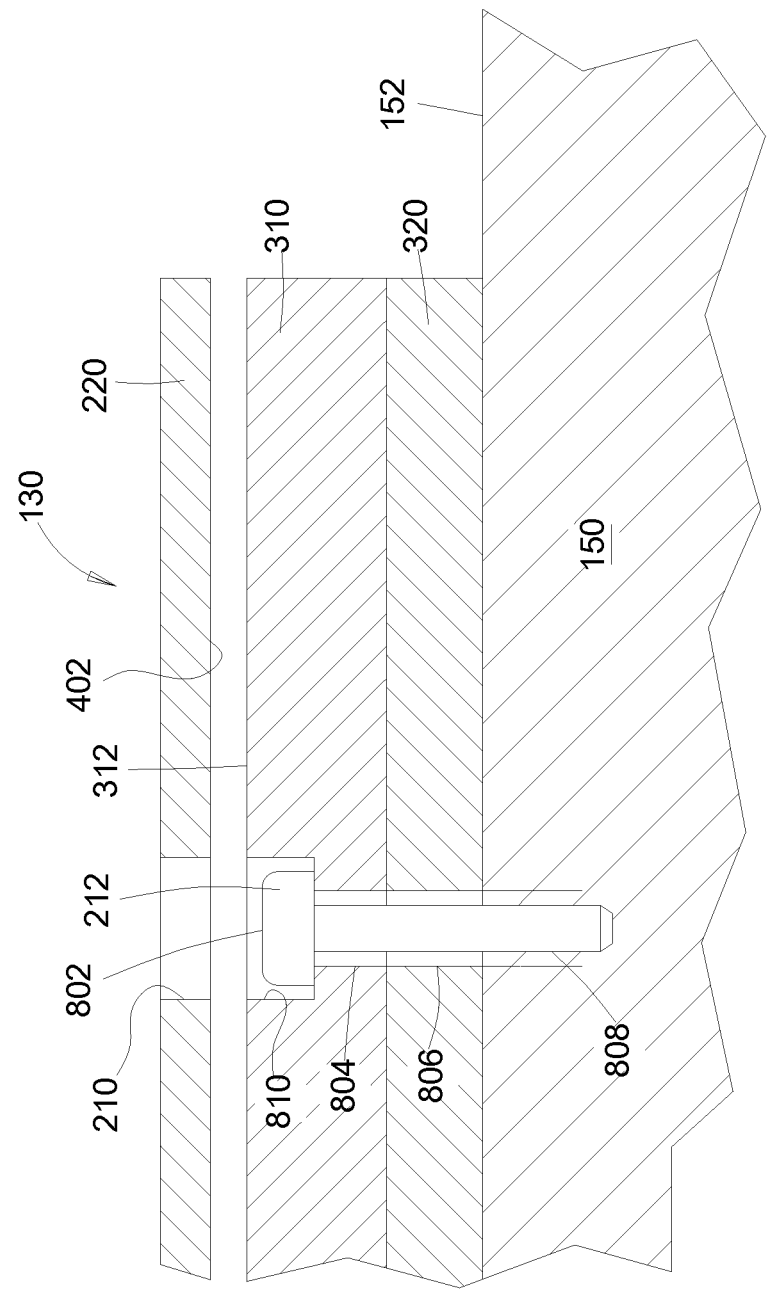

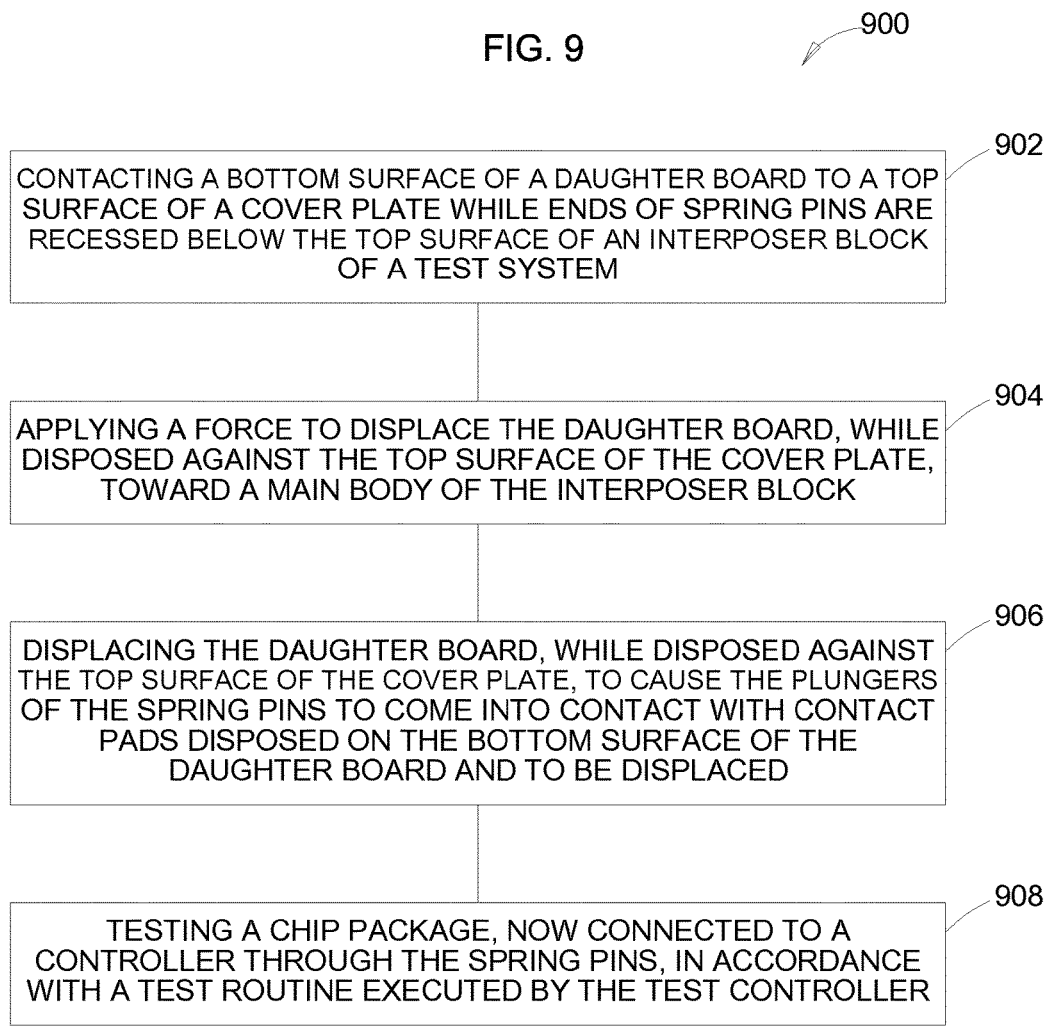

INTERPOSER BLOCK WITH RETRACTABLE SPRING PIN TOP COVER PLATE

TECHNICAL FIELD

Embodiments of the present invention generally relate to an integrated circuit chip package assembly test system having an interposer block, the interposer block configured to protect spring pins prior to engagement with an integrated circuit package being tested in the integrated circuit chip package assembly test system.

BACKGROUND

Electronic devices, such as tablets, computers, copiers, digital cameras, smart phones, control systems and automated teller machines, among others, often employ electronic components which leverage integrated circuit (e.g., chip) package assemblies for increased functionality and higher component density. Chip package assemblies are tested on chip package assembly test systems that utilized mother boards and daughter boards to provide flexibility for testing various chip package assembly designs. Spring pins are typically utilized to make the electrical connections between the mother and daughter boards. However, the spring pins are highly susceptible to damage. For example, the exposed spring pin tips that contact the daughter boards often are damaged during removal and replacement of the daughter board to accommodate testing of chip package assemblies having different designs. Damaged spring pins may undesirably not only damage the daughter board, but require maintenance downtime for servicing the test equipment that increases the cost of ownership and production.

Therefore, a need exists for an improved test system and method for testing integrated circuit packages.

SUMMARY

An interposer block, a chip package assembly test system and method for testing a chip package assembly are described herein. In one example, an interposer block for an integrated circuit chip package test system is provided. The interposer block includes a main body, a retainer plate, and a cover plate. A plurality of spring pins are each disposed in a respective one of a plurality of spring pin receiving holes formed in the main body. The retainer plate is coupled to the main body and captures the spring pins within the plurality of spring pin receiving holes. The cover plate is movably coupled to the main body. The cover plate has a plurality of spring pin clearance holes form therethrough that align with the plurality of spring pin receiving holes formed in the base plate. A spring biasing the cover plate away from the main body to a position where the spring pins not an exposed through a top surface the cover plate, and where the cover plate is movable towards the main body to a position that exposes the spring pins through the top surface of the cover plate.

In another example, an integrated circuit chip package test system is provided. The test system includes an interposer block disposed in between a mother board and a daughter board. A top surface of the daughter board has a socket configured to receive a chip package for testing. A bottom surface of the daughter board has a plurality of electrical contact pads that pushes the spring pin residing in the interposer block that is mounted on the top surface of the mother board. The same bottom surface contact pads are coupled to the socket via electrical trace routing of the daughter board. A top surface of the mother board has a pattern of a plurality of electrical contact pads that accommodate an interposer block mounted via different screws recessed in to the main body of the interposer block. These mother board contact pads are coupled to the test system via a routing on the mother board from the Interposer block pad pattern to the test pad pattern interface. The test system also includes a pusher configured to urge a chip package towards the socket. The interposer block includes a main body, a plurality of spring pins, a spring, and a retainer plate. Each of spring pin is disposed in a respective one of a plurality of spring pin receiving holes disposed in the main body and contacts a contact pad of the plurality of contact pads of the mother board with a contact pad of the plurality of contact pads of the daughter board. The retainer plate is coupled to the main body and captures the spring pins within the plurality of spring pin receiving holes. The cover plate is movably coupled to the main body. The cover plate has a plurality of spring pin clearance holes form therethrough that align with the plurality of spring pin receiving holes formed in the base plate. The spring biases the cover plate away from the main body.

In another example, a method for testing a chip package is provided. The method includes contacting the daughter board having a socket configured for testing a chip package to a top surface of a cover plate while ends of spring pins are recessed below the top surface, the cover plate part of an interposer block disposed coupled to a mother board of a test system; applying a force to the daughter board disposed against the top surface of the cover plate and moving the cover plate toward the mother board; engaging and displacing plungers of the spring pins as the cover moves toward the mother board; inserting a chip package in the socket; and testing the chip package utilizing signals transmitted from the test system to the mother board through the spring pins to the daughter board.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 7A-C are partial sectional views of the interposer block illustrating relative displacements of the cover plate and spring pins.

FIG. 7D is partial sectional view of the interposer block illustrating the spacing between the cover plate and main body of the interposer block with the spring pin removed.

FIG. 8 is another schematic sectional view of the interposer block disposed on a portion of the mother board illustrating a fastener securing the interposer block to the mother board of the chip package assembly test system.

FIG. 9 is a flow diagram of a method for testing a chip package assembly.

To facilitate understanding, identical reference numerals have been used, where possible, to designate identical elements that are common to the figures. It is contemplated that elements of one embodiment may be beneficially incorporated in other embodiments.

DETAILED DESCRIPTION

An interposer block for a chip package assembly test system, a chip package assembly test system and method for testing chip package assemblies disclosed herein improve testing throughput by enabling testing of testing chip package assemblies with reduced probability of damage to spring pins utilized to make electrical contact between the contacts of mother and daughter boards of the test system. Since the spring pins are damaged less frequently, the preventative maintenance interval can be extended, resulting in increased test capacity of the test system while reducing the cost of ownership through maintenance labor and replacement part savings.

In one example, an interposer block is utilized to protect the spring pins. The interposer block has a modular construction that includes at least a retractable cover plate, a main body, and a retainer plate. The retractable cover plate, with openings for the spring pins, is spring loaded and retracts when pressure is applied vertically on the cover plate when the daughter board is engaged with the mother board of the test system. The retractable cover protects the spring pins from damage due to inadvertent contact during removal and replacement of the daughter board from the test system, and during service, set-up and handling. Moreover, the modular construction allows the interposer block to be manufactured more efficiently and with tighter tolerances as compared to larger one-piece interposer blocks. As bow, flatness, warpage and twist are more readily controlled using the modular construction, the spring pins are much less likely to bind, thus providing a more robust and reliable test connections, and the benefits of extended service life.

Figure 1:
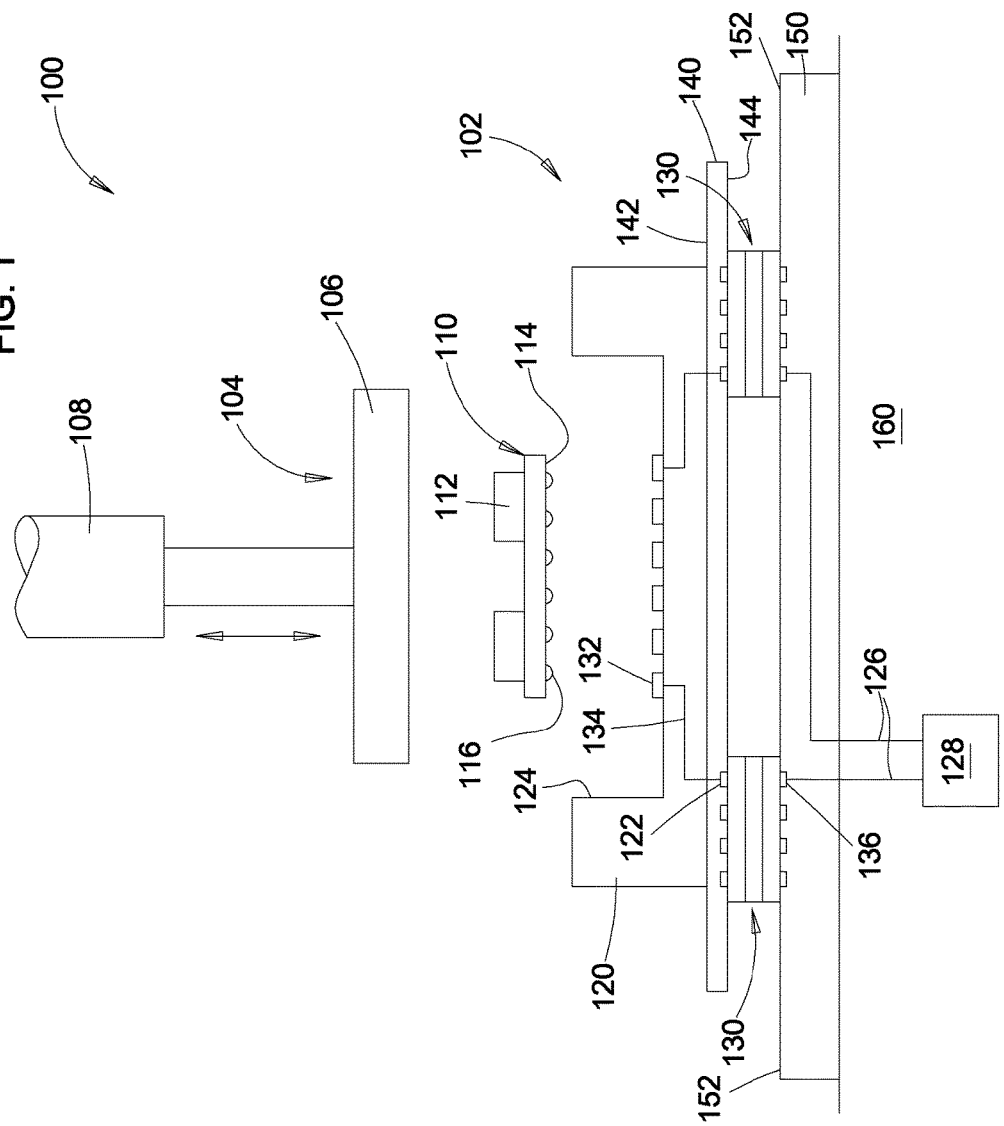
FIG. 1 is a schematic side view of a chip package assembly test system having a daughter board connected to a mother board via one or more interposer blocks.

FIG. 1 is a schematic top view of a chip package assembly test system 100. The chip package assembly test system 100 at least one test station 102, a pusher 104 and a test controller 128. The pusher 104 is configured to engage and secure a chip package assembly (e.g., chip package) 110 to the test station 102 of the test system 100 for testing as further described below.

Exemplary chip packages 110, ball grid array (BGA) packages as a non-limiting example, that may be tested utilizing the test system 100 generally include at least one or more integrated circuit (IC) dice 112 disposed on a package substrate 114. In some embodiments, an interposer (not shown) may be utilized to provide improved interconnection between the one or more IC dice 112, and the package substrate 114. The IC die 112 may be a programmable logic device, such as field programmable gate arrays (FPGA), a memory device, an optical device, a MEMS device, a processor or other IC logic or memory structure. Optical devices include photo-detectors, lasers, optical sources, and the like. Solder bumps 116 are disposed on a bottom surface of the package substrate 114 to facility electrical communication of power, ground and signals to the circuitry of the one or more dice 112 mounted to the package substrate 114. The functionality of the IC die 112 is provided by solid state circuitry formed in the die 112. At the end of the chip package assembly fabrication process, the chip packages 110 are tested to ensure robust and predictable performance.

The test station 102 includes a base 160 to which a mother board 150 and daughter board 140 are coupled. The mother board 150 has a top surface 152 and a bottom surface 154. The bottom surface 154 of the mother board 150 is disposed on the base 160. The top surface 152 of the mother board 150 includes contact pads 136. The contact pads 136 are coupled by electrical routing 126, such as traces and/or wires, to the controller 128 through the base 160.

The daughter board 140 has a top surface 142 and a bottom surface 144. The top surface 142 of the daughter board 140 includes one or more test sockets 120. Only a single test socket 120 is illustrated in FIG. 1 for simplicity. The test socket 120 generally includes a recess 124 configured to receive the chip package 110 to be tested by the test system 100. The recess 124 includes exposed contact pads 132 that are coupled by routing 134 to contact pads 122 formed on the bottom surface 144 of the daughter board 140. The contact pads 132 are arranged to mate with the solder bumps 116 of the chip package 110 to facilitate electric communication between the controller 128 and the chip package 110 during testing.

The pusher 104 of the test system 100 includes a pusher plate 106 coupled to an actuator 108. The actuator 108 is operable to move the pusher plate 106 towards and away from the socket 120. The actuator 108 is configured to push the chip package 110 with the pusher plate 106 into the socket 120 with sufficient force to ensure robust electrical contact between the solder bumps 116 of chip package 110 and contact pads 132 formed in the recess 124 of the socket 120 to facilitate effective communication of power, ground and signals that facilitate testing of the chip package 110. The actuator 108, such as a pneumatic cylinder, ball screw, or other linear actuator, that can control the force exerted by the pusher plate 106 that pushes the chip package 110 against the socket 120. In one example, the actuator 108 is operable to urge the pusher plate 106 downward against the chip package 110 with a force of about 35 grams per solder bump 116. The actuator 108 and pusher plate 106 are supported over the test socket 120 by a stanchion or gantry not shown in FIG. 1.

As discussed above with reference to FIG. 1, the test station 102 is coupled to the test controller 128. The test controller 128 generally executes test routine (e.g., predetermined test routine) that is stored in or accessible by the test controller 128. The test routine may be inputted into the test controller 128 through a user interface, or uploaded or accessed from the test controller 128 and/or host processing system (not shown). The test controller 128 executes the test routine in a manner that runs a predefined test on the chip package 110 disposed in the socket 120 of the test station 102. The test routine may be one or more of a DC test routine, a burn-in routine, post burn-in routine, a final test routine or other predefined test routine to be performed on the chip package 110.

In one example, a DC test routine is performed on chip package 110 disposed in the socket 120 of the test station 102. The DC test routine may include subjecting the chip package 110 to a high DC load for a period to time, and testing the chip package 110 for electrical shorting, resistance, temperature rise, RC delay, speed, other performance characteristic or malfunction or other defect.

In another example, a burn-in test routine is performed on chip package 110 disposed in the socket 120 of the test station 102. The burn-in test routine may include subjecting the chip package 110 to a high-stress environment, such as high voltage, high amperage, high temperature and/or high frequency electric signals. The burn-in test routine may include subjecting the chip package 110 to a high-stress environment for a period to time, and testing the chip package 110 for a short, resistance, temperature rise, RC delay, speed, other performance characteristic or malfunction or other defect.

In yet another example, a post burn-in test routine is performed on chip package 110 disposed in the test station 102. The post burn-in test routine may include testing the electrical characteristics and function of the chip package 110 at room temperature and below room temperature. The post burn-in test routine may include subjecting the chip package 110 to a room temperature environment for a period to time, and testing the electrical characteristics and function of the chip package 110. The post burn-in test routine may also include subjecting the chip package 110 to a sub-room temperature environment for a period to time, and testing the electrical characteristics and function of the chip package 110. The post burn-in test routine may include determining test information, such as performance, functionality, pass, fail or other performance information associated with the tested chip package 110. Other performance may include, but is not limited to, one or more of resistance, temperature rise, RC delay, speed, malfunction or other defect In still yet another example, a final test routine is performed on chip package 110 disposed in the test station 102. The final test routine may include testing the electrical characteristics and function of the chip package 110 at a temperature elevated above room temperature (e.g., elevated temperature such as at about 155 degrees Celsius) and/or at a temperature below room temperature (e.g., cold temperature such as at about −55 degrees Celsius). The final test routine may include subjecting the chip package 110 to an elevated (and/or cold) temperature environment for a period to time, and testing the electrical characteristics and function of the chip package 110. The final test routine may include determining test information, such as performance, functionality, pass, fail or other performance information, to the information stored on the test controller 128 and uniquely associated with the tested chip package 110.

In yet another example, the final test routine performed on chip package 110 may mimic operating conditions of the device in which the chip package 110 will be interfaced with. The operating conditions of the final test routine may include temperature variation and voltage fluctuations. It is contemplated that other test routines may be performed in the test station 102 or other test station within the test system 100.

Since chip packages 110 having different designs often have different patterns for solder bumps 116 formed on the bottom surface of the package substrate 114 that do not match the pattern of contact pads 132 disposed in the bottom of the socket 120, the daughter board 140 is replaced with another daughter board 140 having a socket 120 that is configured to mate with the next chip package 110 to be tested in the test system 100. An interposer block 130 is disposed between the daughter board 140 and the mother board 150 to enable rapid and reliable electrical connections and disconnections between the boards 140, 150 so that the daughter board 140 may be quickly replaced with minimal downtime of the test system 100. Thus, the daughter board 140 may be quickly disconnected from the interposer blocks 130 may be switched out with another daughter board 140 having a socket 120 configured to accommodate different solder bump layouts of a different chip package 110 to be tested.

Figure 2:
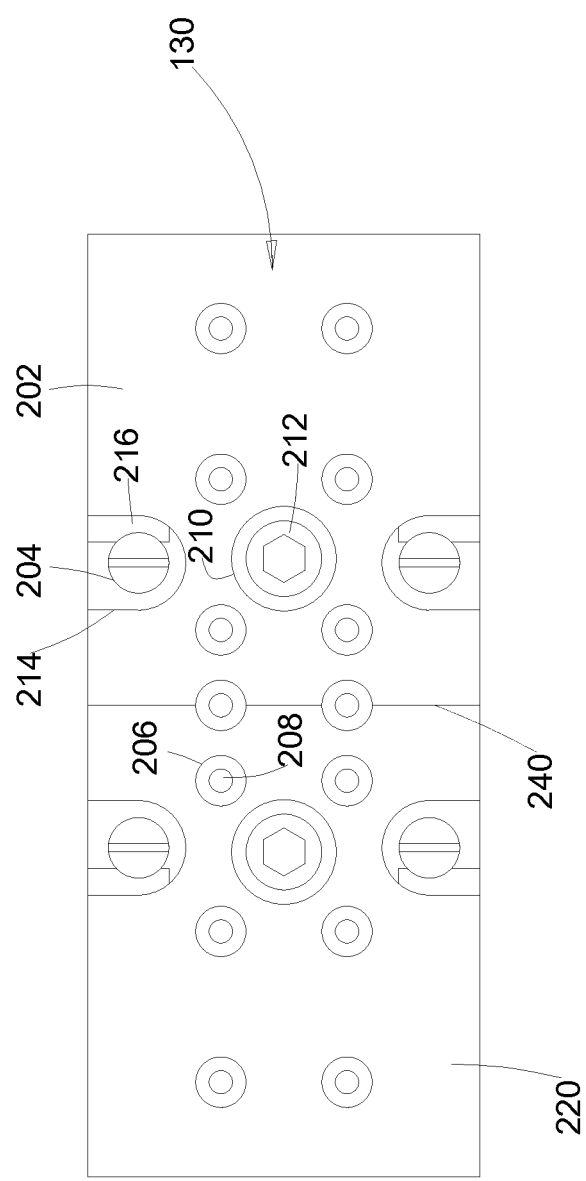
FIG. 2 is a schematic top view of the interposer block disposed on a portion of the mother board illustrated in FIG. 1.

FIG. 2 is a schematic top view of an example of the interposer block 130 disposed on the mother board 150 of the chip package assembly test system 100 of FIG. 1. The interposer block 130 may be rectangular, or have another suitable geometry. The interposer block 130 may optionally be split into two or more sections, as shown by dashed parting line 240. By fabricating the interposer block 130 in multiple sections, the interposer block 130 may be manufactured with greater flatness and less warpage, which enables more robust connection between the mother and daughter boards 150, 140, and ultimately better performance of the test system 100.

The interposer block 130 illustrated in FIG. 2 includes a cover plate 220 and a plurality of spring pins 208. The cover plate 220 has a top surface 202 that contacts the daughter board 140 during testing. The cover plate 220 includes at least a first plurality of holes 206 and a plurality of slots 214. Each of the holes 206 circumscribes and allows free passage of a respective one of the plurality of spring pins 208 through the cover plate 220. The number and geometric pattern and spacing of the holes 206 and spring pins 208 may vary as needed for particular testing applications.

The cover plate 220 may also include at least a second plurality of holes 210. Each of the holes 210 circumscribes and allows free passage of a fastener 212 utilized to couple and secure the interposer block 130 to the mother board 150 without removing the cover plate 220 The holes 210 have sufficient clearance to allow passage of the entire fastener 212 through the cover plate 220 of the interposer block 130 so that the cover plate 220 may move freely without interference from the fastener 212.

The plurality of slots 214 allows access through the cover plate 220 to fasteners 204 utilized to retain the cover plate 220 to the interposer block 130. A bottom surface of the head of the fasteners 204 engage a ledge 216 of the cover plate 220, thus limiting the distance the cover plate 220 may separate from the other components of the interposer block 130. The spacing between the cover plate 220 from the other components of the interposer block 130 is described below in greater detail with reference to FIGS. 3-4.

Figure 3:
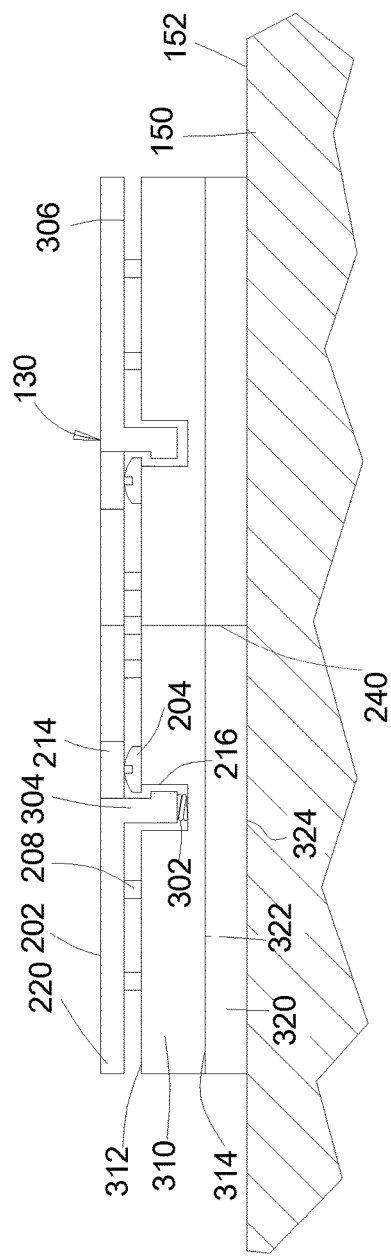
FIG. 3 is a schematic side view of the interposer block disposed on a portion of the mother board.

FIG. 3 is a schematic side view of the interposer block 130 disposed on the mother board 150 of the chip package assembly test system 100 of FIG. 1. Along with the cover plate 220, the interposer block 130 includes a main body 310 and retainer plate 320. The main body 310 includes a top surface 312 and a bottom surface 314. The thickness of the main body 310 defined between the top surface 312 and the bottom surface 314 is greater than a thickness of the retainer plate 320, such as for example, at least two times as thick. The top surface 312 of the main body 310 faces a bottom surface 306 of the cover plate 220. The bottom surface 314 of the main body 310 faces and is coupled against a top surface 322 of the retainer plate 320. A bottom surface 324 of the retainer plate 320 faces and is coupled against the top surface 152 of the mother board 150.

A leg 304 extends downward from the bottom surface 306 of the cover plate 220. The ledge 216 extends laterally from the leg 304 and faces the bottom surface 306 of the cover plate 220. The ledge 216 limits the upward travel, and thus spacing, of the cover plate 220 above the top surface 312 of the main body 310.

A spring 302 is disposed between the cover plate 220 and the main body 310. The spring 302 is utilized to bias the cover plate 220 away from and into a spaced-apart relationship with the top surface 312 of the main body 310. The spring 302 may contact the bottom surface 306 of the cover plate 220, or be interfaced with the leg 304 as shown in FIG. 3. The spring 302 may be a coil spring or other spring form, such as a flat spring, Belleville spring washer, an elastomeric spring form, or other suitable spring type. The leg 304 and spring 302 are shown and described in greater detail with reference to FIG. 4.

Figure 4:
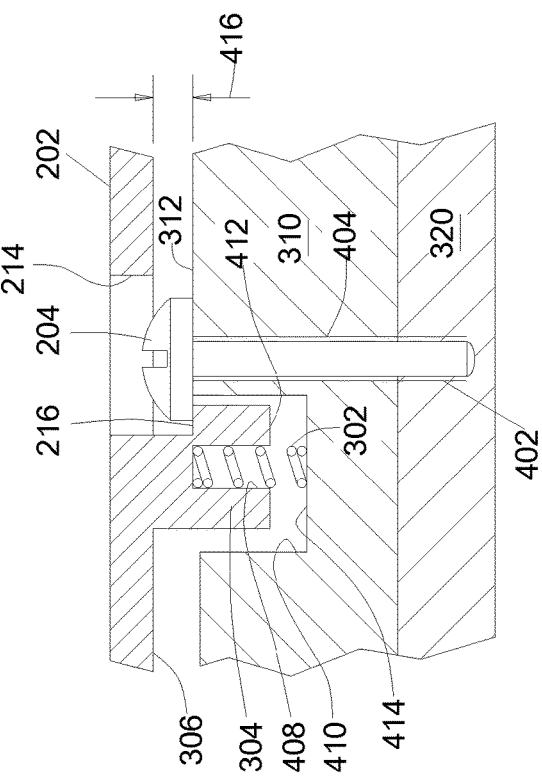
FIG. 4 is a partial sectional view of a portion of the interposer block illustrating springs utilized to bias a cover plate above other portions of the interposer block.

FIG. 4 is a partial sectional view of a portion of the interposer block 130 illustrating one of the springs 302 utilized to bias the cover plate 220 above other portions of the interposer block 130, e.g., the main body 310. The spring 302 has one end disposed against the main body 310 and a second end disposed against the cover plate 220. The number and force generated by each spring 302 may be selected to minimally generate enough force to space the cover plate 220 from the main body 310, and to allow sufficient compression so that the cover plate 220 abuts the main body 310 upon maximum displacement of the cover plate 220, for example, through a distance 416.

In the example depicted in FIG. 4, the leg 304 includes a blind hole 408 formed in a bottom 412 of the leg 304. The blind hole 408 is sufficiently deep enough to accommodate most of the length of the spring 302 so that the spring 302 does not appreciably buckle when compressed. The bottom 412 of the leg 304 is spaced a distance above a bottom 414 of a recess 410 formed in the top surface 312 of the main body 310 so that the cover plate 220 may travel the full distance 416 without the bottom 412 of the leg 304 contacting the bottom 414 of the recess 410. In other embodiments, the distance the bottom 412 of the leg 304 extends from the bottom surface 306 of the cover plate 220 may be selected to limit the distance that the cover plate 220 may be displaced so that upon full displacement of the cover plate 220, the travel of the cover plate 220 is limited by the bottom 412 of the leg 304 contacting the bottom 414 of the recess 410 prior to the bottom surface 306 of the cover plate 220 contacting the top surface 312 of the main body 310. Alternatively, the blind hole 408 accommodating the spring 302 may be formed in the main body 310, either in the bottom 414 of the recess 410, the top surface 312 of the main body 310, or in the bottom surface 306 of the cover plate 220.

As discussed above, the fastener 204 is utilized to limit the travel and capture (e.g., retain) the cover plate 220 to the main body 310. The fastener 204 is also utilized to hold the main body 310 to the retainer plate 320. In the embodiment depicted in FIG. 4, the main body 310 includes a clearance hole 404 that aligns with the slot 214 formed through the cover plate 220 and a hole 402 formed in the retainer plate 320. The hole 402 may be threaded to engage the threads of the fastener 204, thus securing the retainer plate 320 to the main body 310. Alternatively, the hole 402 formed in the retainer plate 320 may extend through the retainer plate 320 to allow a nut or other complimentary threaded fastener (not shown) to engage the fastener 204 can bolt the retainer plate 320 to the main body 310.

Alternatively, the fastener 204 may be used only to retain the cover plate 220 to the main body 310 without securing the main body 310 to the retainer plate 320. In such embodiments, another fastener (not shown) is utilized to secure the main body 310 to the retainer plate 320.

Figure 5:
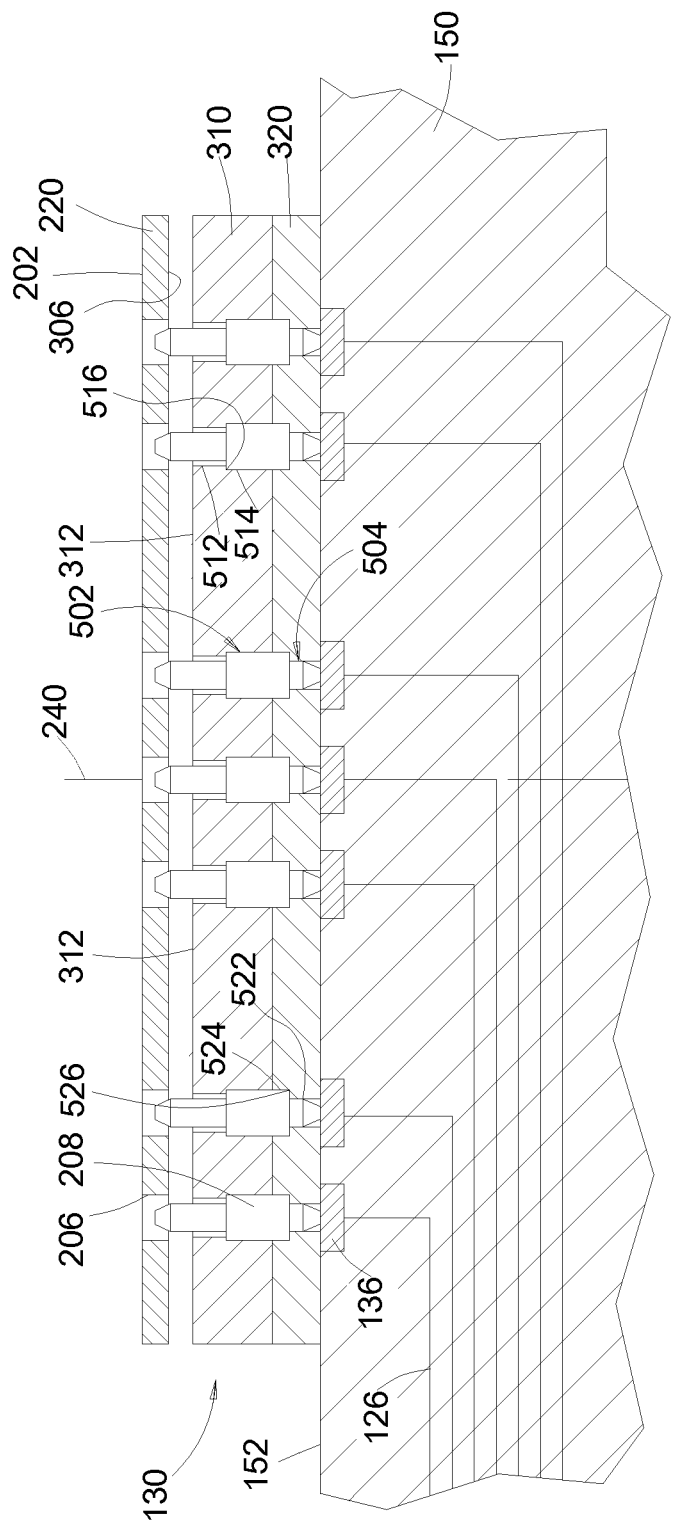
FIG. 5 is a schematic sectional view of the interposer block disposed on a portion of the mother board illustrating a plurality of spring pins.

FIG. 5 is a schematic sectional view of the interposer block 130 disposed on the mother board 150 of the chip package assembly test system 100 of FIG. 1 illustrating the plurality of spring pins 208 retained in the interposer block 130. The number and pitch of the spring pins 208, along with the number of interposer blocks 130 disposed between the mother and daughter boards 140, 150, may be selected as needed to accommodate specific communication, ground and power transmission requirements between the mother and daughter boards 140, 150 needed in order to facilitate testing of the chip package 110 under test. In one embodiment, a diameter of each spring pin 208 is sized to allow a centerline to centerline pitch between axially aligned spring pins 208 of at least as small as 1.0 mm. In other examples, the centerline to centerline pitch may be as small as 0.4 mm. The spring pins 208 have a range of motion (i.e., stroke, or axial displacement) of may be in the range of 0.7 to 2.0 mm. The spring pins 208 may generate a force at mid stroke of between about 0.25 to 5.00 newton (N), such as 0.25 and 1.00 N.

Figure 6:
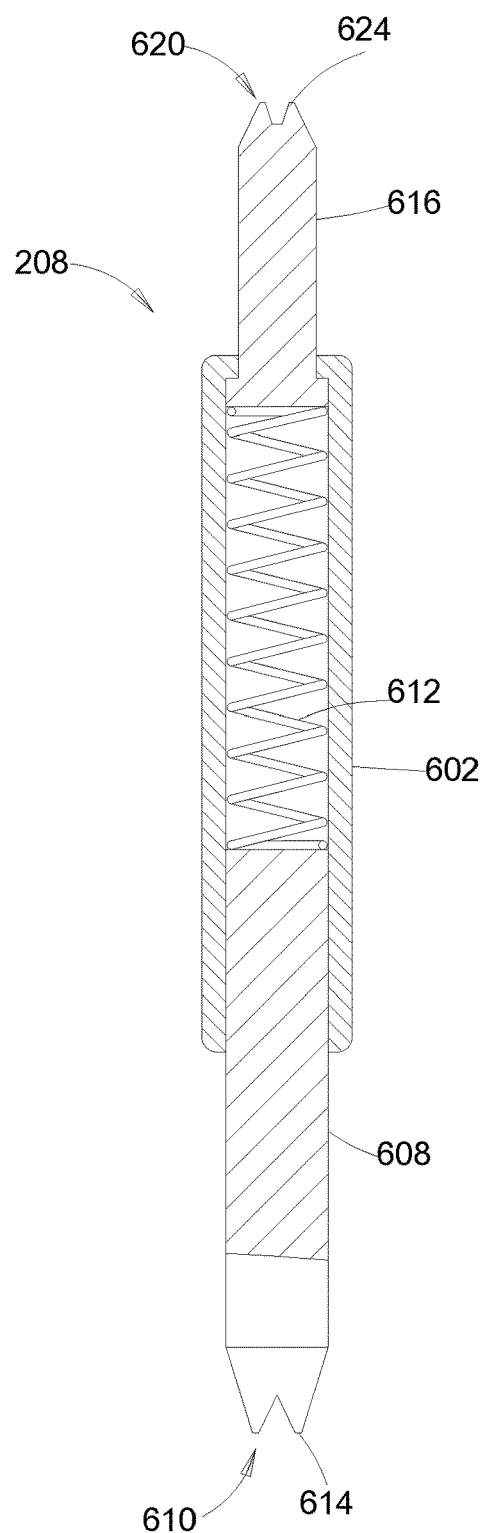
FIG. 6 is a schematic sectional view of an exemplary spring pin.

One example of the exemplary spring pin 208 is depicted in a schematic sectional view of FIG. 6. The spring pin 208 illustrated in FIG. 6 provides an electrically conductive path suitable for signal transmission through the interposer block 130 between the contact pads 122 of the daughter board 140 and the contact pads 136 of the mother board 150 such that signal transmission is effectuated between the DUT (e.g., the chip package 110) and the controller 128 of the test system 100. The particular configuration of the spring pin 208 described herein is for illustration, and it is contemplated that other spring pins, such as spring pins with external springs, H-configurations, MEMS construction, stamped components, sliders, or other configurations, can be utilized.

The spring pin 208 illustrated in FIG. 6 includes a first plunger 608, a second plunger 616, and a spring 612. An electrically conductive path is defined between the exposed opposite exposed ends 610, 620 of the first and second plungers 608, 616 through the spring pin 208. The electrically conductive path defined through the spring pin 208 has physical properties selected to provide sufficient power, ground and signal transmission through the spring pin 208 when the test controller 128 is communicating with the package 110 through the test station 102. The plungers 608, 616 may move relative to each other, thus setting the stroke or travel of the spring pin 208.

The first plunger 608 may be cylindrical or have another sectional geometry. The first plunger 608 may be fabricated from a material suitably rigid enough to withstand an axial compression force exerted on the spring pin 208 when the daughter board 140 is fastened against the mother board 150, thus clamping the interposer block 130 therebetween. Suitable metals include brass, stainless steel, and titanium, among other conductive materials. The second plunger 616 may be similarly fabricated.

The spring pin 208 may further include a shell 602. The shell 602 optionally may be part of the first plunger 608. The shell 602 may be fabricated from the same materials as described above with reference to the first plunger 608. The first plunger 608 and the shell 602 may be fabricated from the same materials, or fabricated from different materials.

A cavity is formed through the shell 602 to accommodate the spring 612. The first plunger 608 may be fixed to the shell 602 using adhesives, a press fit engagement, a swaged connection, threads, crimping, brazing, welding, fasteners or other suitable technique. In another example, the first plunger 608 is movably disposed in the cavity of the shell 602 so that the first plunger 608 may move axially relative to the shell 602. In such embodiment where it is desirable for the first plunger 608 to move axially relative to the shell 602, the end of the first plunger 608 may be captured in the cavity of the shell 602 to prevent disengagement of the first plunger 608 from the shell 602. The first plunger 608 may be mechanically captured in the cavity of the shell 602 using a lip and head, as shown in FIG. 6, or alternatively using pins, retaining rings, bayonet fitting or other suitable technique.

The second plunger 616 is engaged with the cavity of the shell 602 in a manner that allows for the second plunger 616 to move axially relative to the shell 602. For example, the shell 602 includes a flange that has an inner diameter sized to allow the second plunger 616 to extend therethrough so that the second plunger 616 may be displaced axially through the second end of the shell 602 without significant restriction of movement. The flange may be formed by crimping the shell 602, heading, or other suitable technique. The inner diameter of the flange is smaller than a diameter of a head formed at the second end of the second plunger 616, thus capturing the second plunger 616 within the cavity by preventing the second plunger 616 from completely sliding out of the cavity through the second end of the shell 602. In one example, the second plunger 616 may be displaced axially through a distance of about 0.5 to about 2.5 millimeters relative to the first plunger 608.

The spring 612 is fabricated from a conductive or non-conductive material, and is disposed between the first plunger 608 and the second plunger 616. The spring 612 biases the first plunger 608 away from the second plunger 616. The spring 612 may be disposed within or outside of the shell 602. In the example depicted in FIG. 1, the spring 612 is disposed in the cavity of the shell 602.

The spring 612 generates a determined pre-load force when the second plunger 616 is fully extended from the shell 602. In one example, the spring 612 is selected to generate a force of between about 0.25 to 1.00 newton (N) at about half the stroke of the second plunger 616.

In the example depicted in FIG. 6, the exposed end 610 of the first plunger 608 may include one or more pointed features 614. The pointed features 614 enhance the performance of the electrical connection between the spring pin 208 and the contact pads 136 formed on the top surface 152 of the mother board 150. Similarly, the exposed end 620 of the second plunger 616 may include one or more pointed features 624. The pointed features 624 enhance the performance of the electrical connection between the spring pin 208 and the contact pads 122 formed on the bottom surface 144 of the daughter board 140. The pointed features 614, 624 may be a chisel point, a cone, a dimple or dimples, a ridge or ridges, or other geometric configuration that reduces the contact area of the plungers 608, 616.

Referring back to FIG. 5, each spring pin 208 is respectively captured in a pair of holes 502, 504. The holes 502, 504 have collinear centerlines formed through the interposer block 130. The collinear centerlines of the holes 502, 504 are also aligned collinearly with the centerlines of the holes 206 formed through the cover plate 220. The details of the holes 502, 504 are allow illustrated in the enlarged view of FIG. 7C.

Referring to both FIGS. 5 and 7C, the hole 502 is formed through the main body 310. The hole 502 includes a smaller diameter section 512 exiting the main body 310 through the top surface 312 and a larger diameter section 514 exiting the main body 310 through the bottom surface 314. A step 516 is defined between the sections 512, 514. The smaller diameter section 512 has a diameter selected to allow the second plunger 616 to freely move within the hole 502. The larger diameter section 514 has a diameter selected to accommodate the shell 602 of the spring pin 208, as the shell 602 has a diameter larger than the plungers 608, 616. The step 516 prevents the shell 602 of the spring pin 208 from moving out of the hole 502 through the top surface 312 of the main body 310.

The larger diameter section 514 may have a length that is greater than a length of the smaller diameter section 512. The longer length of the larger diameter section 514 allow for more robust manufacturing and tighter tolerances as smaller holes are more difficult to form precisely, particularly over longer lengths.

In one example, the greater thickness of the main body 310 relative to the retainer plate 320 allows the larger diameter section 514 to be sufficiently long enough to house most of, and in other examples, all of the shell 602 of the spring pin 208. Thus, the complimentary hole 504 formed through the retainer plate 320 may be shorter and less expensive to fabricate.

Similarly, the hole 504 is formed through the retainer plate 320. In embodiments wherein the entire casing resides in the hole 502, the hole 504 need only have a diameter similar to the smaller diameter section 512 so that the first plunger 608 may freely travel therethrough. In this example, hole 504 is sized to capture the spring pin 208 within the hole 502 when the main body 310 and the retainer plate 320 are coupled together.

In the embodiment depicted in FIG. 5, the hole 504 includes a smaller diameter section 522 exiting the retainer plate 320 through the bottom surface 324 and a larger diameter section 524 exiting the retainer plate 320 through the top surface 322. A step 526 is defined between the sections 522, 524. The smaller diameter section 522 has a diameter selected to allow the first plunger 608 to freely move within the hole 504. The larger diameter section 524 has a diameter selected to accommodate the shell 602 of the spring pin 208. The diameter of the larger diameter sections 514, 524 may be the same. The step 526 prevents the shell 602 of the spring pin 208 from moving out of the hole 504 through the bottom surface 324 of the retainer plate 320.

Similar to the hole 502 formed through the main body 310, the larger diameter section 524 of the hole 504 may have a length that is greater than a length of the smaller diameter section 522. The longer length of the larger diameter section 524 allow for more robust manufacturing and tighter tolerances as smaller holes are more difficult to form precisely, particularly over longer lengths.

Thus, as the main body 310 is secured against the retainer plate 320. The shell 602 (or other portion of the spring pin 208 having a diameter greater than that of the plungers 608, 616) is retained by the steps 516, 526 within the larger diameter sections 514, 524 of the holes 502, 504.

Utilizing two plates (i.e., the main body 310 and the retainer plate 320) to capture the spring pins 208 has a number of advantages. Firstly as discussed above, the holes 502, 504 may be formed with greater precision and closer tolerances due to the larger diameter sections 514, 524, comprising a greater percentage of the total length of the hole (relative to the smaller diameter sections 512, 524). This enables tighter pitches and better parallelism between the holes 502, 504. Improved parallelism between the holes 502, 504 reduces the propensity of the spring pins 208 to bind within the holes 502, 504, thus allowing for more reliable electrical contact and longer spring pin service life. Additionally, since the holes 502, 504 are formed in two plates (e.g., the main body 310 and retainer plate 320), each holes 502, 504 has a shorter length relative to a single hole that conventionally accommodates a spring pin. The shorter length provides the similar benefits of tighter pitches and improved parallelism as compared to longer holes through a single component. Moreover, flatness and warpage may be better controlled utilizing two thinner plates (e.g., the main body 310 and retainer plate 320) coupled together as opposed to a single plate that is thick enough to accommodate the entire spring pin. The improved flatness and warpage control enables more robust and reliable electrical connections between the mother and daughter boards 140, 150, and ultimately with the DUT (i.e., the chip package 110).

FIGS. 7A-C are partial sectional views of the interposer block 130 illustrating various displacements of the cover plate 220 and spring pins 208 relative to the main body 310. As illustrated in FIG. 7A, the bottom surface 306 of the cover plate 220 is spaced above the top surface 312 of the main body 310 when no force is applied to the top surface 202 of the cover plate 220. The end 620 of the spring pin 208 is flush with or recessed a distance 702 below the top surface 202 of the cover plate 220. In this manner, the end 620 of the spring pin 208 is protected by the cover plate 220 from inadvertent contact and damage.

As illustrated in FIG. 7B, the distance 416 that the cover plate 220 is spaced from the main body 310, along with the thickness of the cover plate 220, are selected such that the end 620 of the spring pin 208 protrudes through the top surface 202 of the cover plate 220 when the cover plate 220 is displaced against the main body 310 against the bias of the spring 302. However, the second plunger 616 of the spring pin 208 has sufficient travel that when the cover plate 220 is disposed against the main body 310, the end 620 of the spring pin 208 can be displaced flush with or depressed below the top surface 202 of the cover plate 220, as shown in FIG. 7C, to avoid damage to the spring pin 208 or contact pads 122 of the daughter board 140 contacting the end 620 of the spring pin 208 and top surface 202 of the cover plate 220 during testing of the chip package 110. In the example depicted in FIG. 7C, about half the stoke of the second plunger 616 of the spring pin 208 is utilized when the cover plate 220 is disposed against the main body 310 so that the spring pin 208 may still engage the contact pad 122 of the daughter board 140 with sufficient force to ensure robust and reliable signal transmission between the spring pin 208 and the daughter board 140.

FIG. 7D is partial sectional view of the interposer block 130 illustrating the spacing between the cover plate 220 and the main body 310 of the interposer block 130 with the spring pin 208 removed. With the spring pin 208 removed, the parting line 240 (shown in phantom) clearly illustrates the cover plate 220, the main body 310, and the retainer place 320 are spit into multiple sections to facilitate manufacturing and to achieve tighter flatness and warpage tolerances. Although the parting line 240 splits the cover plate 220, the main body 310, and the retainer place 320 through the holes 206, 502, 504, the parting line 240 may be located in a position that avoids the holes 206, 502, 504. However, having the parting line 240 split the cover plate 220, the main body 310, and the retainer place 320 through the holes 206, 502, 504 enables the spring pin 208 to be utilized to provide alignment between the mating separate sections the cover plate 220, the main body 310, and the retainer place 320.

FIG. 8 is another schematic sectional view of the interposer block 130 disposed on the mother board 150 of the chip package assembly test system 100 of FIG. 1 illustrating one of the fasteners 212 that secures the interposer block 130 to the mother board 150. The fastener 212 extends through aligned clearance holes 804, 806 formed through the main body 310 and retainer plate 320. The holes 804, 806 are aligned with a hole 808 formed in the mother board 150. In the example depicted in FIG. 8, the hole 808 is threaded so that the fastener 212 may threadingly engage the mother board 150, thus clamping the main body 310 and retainer plate 320, and thus the interposer block 130, to the mother board 150. Alternatively, the hole 808 may be formed through the mother board 150 to allow a nut disposed below the mother board 150 to engage the fastener 212 to secure the interposer block 130 to the mother board 150. In another alternative configuration, the 808 may be a clearance hole that aligns with a threaded hole (not shown) formed in the base 160 so that the fastener 212 may secure both the interposer block 130 and mother board 150 to the base 160.

The top surface 312 of the main body 310 includes a counterbore 810. The counterbore 810 is sized to allow a head 802 of the fastener 212 to be recessed below the top surface 312 of the main body 310 once the interposer block 130 is secured to the mother board 150. In this manner, the head 802 of the fastener 212 does not interfere with the motion of the cover plate 220.

The hole 210 formed in the cover plate 220 allows the fastener 212 to be accessed to secure or remove the interposer block 130 from the mother board 150. Alternatively, the cover plate 220 may be solid over the fastener 212, i.e., with no hole 210 present, so that the fastener 212 may only be accessed for installing or removing the interposer block 130 from the mother board 150 with the cover plate 220 removed.

FIG. 9 is a flow diagram of a method 900 for testing a chip package assembly, such as the chip package 110 or other suitable chip package. The method 900 begins at operation 902 by contacting contact pads 122 of a daughter board 140 to a top surface 202 of a cover plate 220 while ends 610 of spring pins 208 are recessed below the top surface 202. The cover plate 220 is part of an interposer block 130 disposed on a mother board 150 of a test system 100. The daughter board 140 has a socket 120 configured to engage a chip package 110 to tested within the test system 100.

At operation 904, force is applied by the daughter board 140 against the top surface 202 of the cover plate 220, causing the cover plate 220 to move toward a main body 310 of the interposer block 130 against the bias of springs 302 separating the cover plate 220 from the main body 310. As the cover plate 220 is displaced by the force, the ends 620 of the spring pins 208 come in contact with contact pads 122 residing on the bottom surface 144 of the daughter board 140 as the cover plate 220 moves relative to the spring pins 208.

At operation 906, the force applied by the daughter board 140 against the top surface 202 of the cover plate 220 continues to displace the cover plate 220 toward a main body 310 of the interposer block 130, while also now displacing the second plungers 616 of the spring pins 208 which are in contact with the contact pads 122 of the daughter board 140. The cover plate 220 and spring pins 208 are displaced a predefined distance, for example, the distance 416, to ensure the spring pins 208 are sufficiently loaded against the pads 122, thus making good electrical contact to ensure robust and effective signal transmission between the mother and daughter boards 140, 150 through the spring pin 208 with the test controller 128 when a chip package 110 is under test.

At operation 908, the chip package 110, now connected to the controller 128 through the spring pins 208, is tested in accordance with a test routine executed by the test controller 128. As described above, the test may be one or more of a DC test routine, a burn-in routine, post burn-in routine, a final test routine or other predefined test routine to be performed on the chip package 110.

Thus, an interposer block, a chip package assembly test system and method for testing a chip package has been provided which improves testing throughput by enabling testing of testing chip package assemblies with reduced probability to spring pins utilized to make electrical contact between the chip package assembly and contacts of the test system from becoming damaged. In one example, an interposer block is utilized to protect the spring pins using a retractable cover plate. Moreover, the modular construction of the interposer block can be manufactured more efficiently and with tighter tolerances compared to larger interposer blocks, thus advantageously enabling tighter control over bow, flatness, warpage and twist. The modular construction reduces the probability of the spring pin binding, thus providing a more robust and reliable test connection.

While the foregoing is directed to embodiments of the present invention, other and further embodiments of the invention may be devised without departing from the basic scope thereof, and the scope thereof is determined by the claims that follow.

What is claimed is:

1. An interposer block for an integrated circuit chip package test system, the interposer block comprising:
    a main body having a top surface, a bottom surface, and a plurality of first spring pin receiving holes exiting through the top and bottom surfaces of the main body;
    a plurality of spring pins, each of spring pin disposed in a respective one of the plurality of spring pin receiving holes;
    a retainer plate coupled to the main body and capturing the spring pins within the plurality of spring pin receiving holes;
    a cover plate movably coupled to the main body, the cover plate having a plurality of spring pin clearance holes form therethrough that align with the plurality of spring pin receiving holes formed in the base plate; and
    a spring biasing the cover plate away from the main body to a position where the spring pins not an exposed through a top surface the cover plate, and where the cover plate is movable towards the main body to a position that exposes the spring pins through the top surface of the cover plate.

2. The interposer block of claim 1, wherein the cover plate further comprises:
    a leg extending into a recess formed in the main body.

3. The interposer block of claim 2, wherein the leg further comprises:
    a ledge extending laterally from the leg, the ledge configured to limit a spacing between the cover plate and main body.

4. The interposer block of claim 3 further comprising:
    a fastener securing the main body to the retainer plate, wherein the fastener engages the ledge when the cover plate is spaced from the main body.

5. The interposer block of claim 4, wherein the cover plate further comprises:
    a slot exposing the fastener through the cover plate.

6. The interposer block of claim 2, wherein the leg further comprises:
    a blind hole in which the spring is disposed.

7. The interposer block of claim 1, wherein the cover plate further comprises:
    a plurality of holes collinearly aligned with holes formed through the main body and the retainer plate.

8. The interposer block of claim 1, wherein the retainer plate further comprises:
    a second plurality of spring pin receiving holes that are collinearly aligned with the first plurality of spring pin receiving holes.

9. The interposer block of claim 1, wherein the cover plate further comprises:
    two or more laterally adjacent sections, each section movable independent from the other sections.

10. An integrated circuit chip package test system comprising:
    a daughter board having a top surface and a bottom surface, the top surface having a socket disposed thereon configured to receive a chip package for testing, the bottom surface having a plurality of electrical contact pads coupled to the socket via routing of the daughter board;
    a mother board having a top surface, the top surface of the mother board having a plurality of electrical contact pads;
    a pusher configured to urge a chip package towards the socket; and
    an interposer block disposed in between the mother board and the daughter board, the interposer block comprising:
        a main body having a top surface, a bottom surface, and a plurality of first spring pin receiving holes exiting through the top and bottom surfaces of the main body;
        a plurality of spring pins, each of spring pin disposed in a respective one of the plurality of spring pin receiving holes and contacting a contact pad of the plurality of contact pads of the mother board with a contact pad of the plurality of contact pads of the daughter board;
        a retainer plate coupled to the main body and capturing the spring pins within the plurality of spring pin receiving holes;
        a cover plate movably coupled to the main body, the cover plate having a plurality of spring pin clearance holes form therethrough that align with the plurality of spring pin receiving holes formed in the base plate; and
        a spring biasing the cover plate away from the main body to a position where the spring pins not an exposed through a top surface the cover plate, and where the cover plate is movable towards the main body to a position that exposes the spring pins through the top surface of the cover plate.

11. The test system of claim 10, wherein the cover plate further comprises:
    a leg extending into a recess formed in the main body.

12. The test system of claim 11, wherein the leg further comprises:
    a ledge extending laterally from the leg, the ledge configured to limit a spacing between the cover plate and main body.

13. The test system of claim 12 further comprising:
    a fastener securing the main body to the retainer plate, wherein the fastener engages the ledge when the cover plate is spaced from the main body.

14. The test system of claim 13, wherein the cover plate further comprises:
    a slot exposing the fastener through the cover plate.

15. The test system of claim 10, wherein the cover plate further comprises:

two or more laterally adjacent sections, each section movable independent from the other sections.

16. The test system of claim 15, wherein each of the first plurality of spring pin receiving holes comprises:

(a) a larger diameter section exiting the bottom surface of the main body; and (b) a smaller diameter section exiting the top surface of the main body, the smaller diameter section collinearly aligned with the larger diameter section; and wherein each of the second plurality of spring pin receiving holes comprises:

(a) a larger diameter section exiting a top surface of the retainer plate; and (b) a smaller diameter section exiting a bottom surface of the retainer plate, the smaller diameter section collinearly aligned with the larger diameter section.

17. The test system of claim 10, wherein the cover plate has a range of motion including a first position where the spring pins are recessed below the top surface of the cover plate and a second position where the spring pins protrude through the top surface of the cover plate.

18. The test system of claim 10 further comprising:

a controller coupled to the spring pins, the controller configured to perform at least one of a DC test routine, a burn-in routine, post burn-in routine, or a final test routine utilizing signals transmitted through the spring pins between the contact pads and chip package.

19. A method for testing a chip package, the method comprising:

contacting a daughter board having a socket configured for testing a chip package to a top surface of a cover plate while ends of spring pins are recessed below the top surface, the cover plate part of an interposer block disposed coupled to a mother board of a test system;

applying a force to the daughter board disposed against the top surface of the cover plate and moving the cover plate toward the mother board;

engaging and displacing plungers of the spring pins as the cover plate moves toward the mother board;

inserting a chip package in the socket; and testing the chip package utilizing signals transmitted from the mother board through the spring pins to the daughter board.

20. The method of claim 19, wherein testing comprises:

performing at least one of a DC test routine, a burn-in routine, post burn-in routine, or a final test routine.

* * * * *